United States Patent
Elsässer et al.

(12)

(10) Patent No.: US 6,420,081 B1
(45) Date of Patent: Jul. 16, 2002

(54) PROCESS FOR THE PRODUCTION OF BACK-COATING RECORDING MATERIAL FOR THE PRODUCTION OF OFFSET PRINTING PLATES

(75) Inventors: Andreas Elsässer, Idstein; Michael Dörr; Steffen Denzinger, both of Mainz, all of (DE); Paul Coppens, Turnhout (BE)

(73) Assignee: AGFA-Gevaert (BE)

( * ) Notice: Subject to any disclaimer, the term of this patent is extended or adjusted under 35 U.S.C. 154(b) by 0 days.

(21) Appl. No.: 09/843,569

(22) Filed: Apr. 26, 2001

Related U.S. Application Data

(60) Provisional application No. 60/206,782, filed on May 24, 2000.

(30) Foreign Application Priority Data

May 5, 2000 (EP) ............................................. 00201622

(51) Int. Cl.$^7$ .......................... G03C 1/77; G03C 11/22; G03F 7/09
(52) U.S. Cl. ....................... 430/264; 430/204; 430/227; 430/264; 430/525; 430/935; 430/276.1
(58) Field of Search .............................. 430/276.1, 204, 430/525, 227, 264, 935

(56) References Cited

U.S. PATENT DOCUMENTS 5,650,258 A * 7/1997 Doyle et al. ................ 430/525

6,187,507 B1 * 2/2001 Gates et al. ............. 430/271.1

FOREIGN PATENT DOCUMENTS

| EP | 0490515 A1 | 6/1992 |
|---|---|---|
| EP | 0528395 A1 | 2/1993 |
| EP | 0690349 A1 | 1/1996 |
| EP | 0791858 A1 | 8/1997 |
| GB | 2324381 | 10/1998 |

* cited by examiner

Primary Examiner—Richard L. Schilling
(74) Attorney, Agent, or Firm—Leydig, Voit & Mayer, Ltd.

(57) ABSTRACT

The invention relates to a process for the production of a photosensitive recording material for the production of offset printing plates which comprises a dimensionally stable, two-dimensional support of a metal or metal alloy and a silver halide-containing, photosensitive layer on the front of the support and a layer which essentially consists of an organic polymeric material and is resistant to processing chemicals on the back of the support. The layer on the back of the support is applied before the photosensitive coating on the front. The invention furthermore relates to a corresponding recording material in which the layer on the back comprises at least one organic polymer having a glass transition temperature $T_g$ of 50° C. or above. Due to the back coating, the formation of local elements between the metallic support and the silver-containing layer is reliably prevented when the recording materials are stacked. Coating flaws during application of the photosensitive coating have been virtually eliminated.

14 Claims, No Drawings

PROCESS FOR THE PRODUCTION OF BACK-COATING RECORDING MATERIAL FOR THE PRODUCTION OF OFFSET PRINTING PLATES

This application claims the benefit of U.S. Provisional Patent Application No. 60/206,782, filed May 24, 2000.

The invention relates to a process for the production of a photosensitive recording material for the production of offset printing plates, having a dimensionally stable, two-dimensional support of a metal or metal alloy, a silver halide-containing, photosensitive layer on the front of the support, and a layer which essentially consists of an organic polymeric material and is resistant to processing chemicals on the back of the support.

If recording materials having a metal support and a silver halide-containing layer are stored one on top of the other, the contact between the silver-containing layer and the metallic back of the recording material on top frequently causes the formation of local elements, resulting in corrosion phenomena. This is the case in particular if the metallic back has scratches. The passivating layer on the aluminium is damaged at these points, and the reactive metal comes into direct contact with the silver-containing layer. In order to prevent this, sheets of paper are generally placed between the individual recording materials. However, the stacks with the light-sensitive materials are increasingly being processed in automatic equipment, in particular automatic plate setters. The separating paper frequently causes faults in the process. Materials which are to be processed in computer-to-plate (CTP) equipment are therefore frequently unstacked in order to remove the paper. However, this means an additional working step. In addition, scratches can very easily occur on removal of the plates from the stack.

In order to avoid these problems, recording materials of the type mentioned at the outset are used. Thus, in accordance with WO 98/47719, a continuous or discontinuous layer of an inert material is applied to Thus, in accordance with WO 98/47719, a continuous or discontinuous layer of an inert material is applied to the back of the support. The weight of this layer is preferably from 0.5 to 2.0 g/m². In the description of GB-A 2,324,381, it is additionally emphasized, as an essential feature, that the silver halide layer is applied to the aluminium support first, before the back coating. However, the process and the products produced thereby are associated with significant disadvantages. For example, excessively high temperatures must not prevail during production of the back coating so as to avoid damage to the light-sensitive layer. However, warming or heating is necessary if the back coating is initially applied as a solution or dispersion and the solvent is then removed by drying. Furthermore, elevated temperatures are necessary if thermally induced crosslinking and thus curing of the back coating is to be achieved. Although curing using UV radiation avoids high temperatures, scattered light can, however, result in partial exposure of the photosensitive layer.

In addition, known problems occur in the recutting of offset printing plates in stacks. The separating paper normally used prevents the aluminium acting as a solid block in the stacks, and in addition the lubricating action of the commercially available separating papers ensure that the cutting tool blades remain sharp for longer. Very thin back layers, as described in GB-A 2,324,381, generally do not exhibit this action, which results in greater wear of the blades in the cutting tools and in addition in unacceptable cutting burrs on the made-up printing plates.

It is likewise not without problems, when a back coating is applied before the silver halide layer, if an aluminium oxide layer is formed as corrosion protection on the back of the support by anodic oxidation. In this case, coating flaws frequently occur on application of the silver halide layer. White spots are then evident on the copying layer. These so-called "horseshoe flaws" make the recording material unusable.

The object was therefore to provide a process which allows the production of light-sensitive recording materials of the type mentioned at the outset, but which overcomes the disadvantages of the known processes. In particular, the aim was to develop processes which involve less restrictive conditions in the production of the back coating and thus allow a broader choice of materials. Under no circumstances should the back coating result in flaws or impairment of the silver halide layer, as was frequently the case in the previous processes. In addition, it should be possible to make up plates in a stack without problems for greater wear of the blades and in particular also without cutting burrs at the edges of the offset printing plates.

It has now been found that said problems can be solved if a layer of an essentially organic, polymeric material is firstly produced on the back of the metallic support and only then is the silver halide layer produced on the front. The problems in re-cutting in the stack can be avoided if the layer thickness of the organic back layer is at least 1.5 g m$^{-2}$, better at least 2 g m$^{-2}$.

The present application accordingly relates to a photosensitive recording material for the production of offset printing plates which comprises a dimensionally stable, two-dimension support of a metal or metal alloy and a silver halide-containing, photosensitive layer on the front of the support and a layer which essentially consists of an organic polymeric material and is resistant to processing chemicals on the back of the support, which is characterized in that the layer on the back of the support is applied before the photosensitive layer on the front. The term "front" here and below always denotes the side of the support on which the silver halide-containing layer is located.

In a preferred embodiment, the layer on the back comprises at least one organic polymer having a glass transition temperature $T_g$ of 50° C. It is also preferably crosslinked. The crosslinking can be effected here by the action of heat, radiation and/or oxidants.

The back coating generally consists of an organic polymeric material which is virtually insoluble in water and aqueous/alkaline developers. Particularly suitable materials are polyolefins (such as polyethylene, polypropylene, polybutylene, polybutadiene or polyisoprene), polyesters, polycarbonates, polyamides, polysiloxanes, polystyrene, homopolymers or copolymers of or with alkyl acrylate or alkyl methacrylate units (such as polymethyl methacrylate (PMMA) or styrenemethyl methacrylate copolymers), polyvinylacetal, phenoxy resins (for example resins made from bisphenol A and epichlorohydrin), polyvinyl chloride (PVC) or polyvinylidene chloride (PVDC). If necessary, the layer may in addition contain additives in secondary amounts. These include, for example, plasticizers, dyes, pigments, silicone compounds or surfactants. Besides polymeric materials, the layer can also comprise monomeric or oligomeric compounds which polymerize, condense or crosslink under the action of radiation, heat and/or oxidants and thus effect curing of the layer. Particularly suitable for this purpose are addition-polymerizable acrylates or methacrylates, such as ethyl meth(acrylate), propyl (meth)acrylate, butyl (meth)acrylate, 2-hydroxyethyl (meth)acrylate, trimethylolpropane mono-, di- or tri(meth)acrylate or pentaerythritol tri(meth)acrylate. Also suitable are (meth)-acrylamides, such as N-methyl-, N-ethyl-, N-propyl-, N-butyl- or N-isobutyl(meth)acrylamide; furthermore allyl esters, such as allyl acetate; vinyl ethers, such as butyl vinyl ether, octyl vinyl ether, decyl vinyl ether, 2-methoxyethyl vinyl ether, diethylene glycol vinyl ether or benzyl vinyl ether; polyfunctional urethane acrylates which cure under the action of UV radiation, and polyurethanes which cure under the action of heat. In this connection, "(meth)acrylate" means "acrylate and/or methacrylate". A corresponding situation applies to "(meth)acrylamide" and other derivatives of acrylic and methacrylic acid. The back coating may thus also be light-sensitive. For distinction therefrom, the photosensitive layer on the front of the support is referred to as the "silver halide layer" or "image layer", since only this is subjected to imagewise exposure and development.

The weight of the layer on the back is generally from 1.5 to 20 g/m$^2$, preferably from 3 to 10 g/m$^2$. It can be produced by processes which are known per se to the person skilled in the art. A particularly advantageous production process involves pouring-on a liquid which comprises organic polymers dissolved or dispersed in organic solvents, with subsequent drying of the layer applied in this way, if desired followed by crosslinking. However, the coating liquid can also be applied just as well by spin coating or with the aid of knife coaters, flow coaters or other devices. As shown by the examples and comparative examples of the present application (see table), it is essential that the back coating be produced before the photosensitive coating on the front.

The dimensionally stable, two-dimensional support of a metal or metal alloy preferably consists of aluminium or an aluminium alloy. Its front is advantageously mechanically and/or electrochemically roughened and then anodically oxidized and, if necessary, additionally hydrophilized (for example by treatment with polyvinylphosphonic acid). During the anodic oxidation, the back of the aluminium support can also be partly or fully coated with an aluminium oxide layer. The continuous aluminium oxide layer is electrically non-conducting and thus prevents the. formation of local elements between the support and the silver halide-containing layer. However, further layers between the support and the photosensitive layer are likewise possible, for example hydrophilizing layers or priming layers.

It is possible to roll the support provided with back coating up again ("coil-to-coil" process). Since the back layers produced by the process according to the invention are more stable than those conventional hitherto, they suffer virtually no damage during this operation, not even in the interior of the coil, where the strongest forces act thereon. Before the silver halide layer is applied in a further step, this support can therefore be transported and/or stored particularly simply.

The image layer on the front of the support can be built up in a variety of ways. In each case, however, it comprises a silver halide emulsion layer. Preference is given to image layers which work by the silver complex diffusion transfer reversal process, (abbreviated to the DTR process). In this case, they consist of two or more sub-layers, as described in greater detail in EP-A 410 500, EP-A 423 399 or EP-A 883 027. At the bottom, i.e. closest to the support, is usually a receiving layer containing silver nuclei. The nuclei initiate the development of the silver complexes diffusing in, forming a silver image if a suitable developer acts thereon. The development nuclei are preferably produced by application of colloidal silver, gold, platinum, palladium or other metals. They may furthermore consist of heavy-metal sulphides or selenides, for example sulphides of antimony, bismuth, cadmium, cobalt, lead, nickel, palladium, platinum, silver or zinc. Particularly suitable are palladium sulphide and the nickel/silver sulphide, NiS×Ag$_2$S, described in U.S. Pat. No. 4,563,410. Also suitable are polyselenides or polysulphides of heavy metals. In addition, dyes or pigments may be present as antihalation agents, either as a constituent of the nucleus layer or in a separate layer. The type of dye or pigment depends on the spectral region in which the silver halide emulsion layer is sensitive. The nucleus layer is very thin (generally less than 0.5 µm); it normally contains no binder. As already described, the nucleus layer is not absolutely necessary. If no such layer is present, constituents of the metallic support take on the role of the development nuclei. Finally, it is also possible to arrange the image receiving layer or nucleus layer on a separate support. DTR materials of this type consisting of two elements are known in principle.

On top of the receiving layer is located a thin, silver-free interlayer, for example a layer of pigment and a hydrophilic, film-forming polymer, for example polyvinyl alcohol or Pullulan. This is followed next by a silver halide emulsion layer. The silver halide is, for example, silver chloride, bromide, bromoiodide, chlorobromoiodide or a mixture thereof. The silver halide advantageously comprises more than 90% by weight, based on the total weight of the silver halides, of silver chloride. In addition, small amounts of silver chloroiodide and/or silver bromide are frequently also present. The silver halide particles in the emulsion layer normally have an average size of from 0.05 to 1.0 µm, preferably from 0.25 to 0.45 µm. They can also be produced in such a way that the core of the particles has a different composition to the shell. Silver bromide is frequently located exclusively in the core. The binders used for this layer are generally hydrophilic colloids, preferably gelatin. The gelatin is advantageously not hardened. Instead of or in addition to the gelatin, use can also be made of other polymers, for example polyvinyl alcohol, polyvinylpyrrolidone, polyvinylimidazole, poly(meth) acrylamide, polyacrylic acid, cellulose or cellulose derivatives (for example cellulose ethers, such as hydroxyalkyl- or carboxymethylcellulose), starch or alginates. Finally, the emulsion layer may also contain dyes in order to set the spectral sensitivity of the silver halide layer and/or in order to prevent undesired light scattering. These are, for example, methine, cyanine or hemicyanine dyes. Finally, the silver halide layer may also contain conventional emulsion stabilizers, for example azaindenes, especially tetra- or pentaazaindenes. The azaindenes are preferably substituted by amino or hydroxyl groups. An example of an azaindene substituted in this way is 4-hydroxy-6-methyl-1,3,3a,7-tetraazaindene. Suitable stabilizers are also quaternized benzothiazoles, benzotriazoles and heterocyclic mercapto compounds, for example mercapto-substituted tetrazoles and pyrimidines. An example of a tetraazole of this type is 1-[3-(2-sulphobenzoylamino)phenyl]-5-mercaptotetrazole.

In a preferred embodiment, the silver halide emulsion layer may be covered by a protective layer. This generally has a weight of from 0.50 to 1.75 g/m$^2$, preferably from 0.60 to 1.20 g/m$^2$, and advantageously consists of unhardened gelatin (a 10% strength by weight aqueous solution of the gelatin preferably has a viscosity of less than 20 mPa·s at 40° C. and pH 6). The covering layer may itself comprise dyes and/or coloured pigments and/or matting agents. The matting agent here generally consists of particles having an average diameter of from 0.2 to 10 µm, preferably from 0.5 to 6.0 µm. The covering layer may in principle also be built up from a plurality of sub-layers. However, an embodiment of this type is less preferred for practical reasons.

The photosensitive recording material according to the present invention may be imaged in conventional equipment, for example in a vacuum printing-down frame with the aid of an exposure mask. Direct imaging—i.e. imaging without a mask—is also possible, for example with the aid of computer-controlled laser imagesetters.

The imagewise-exposed recording materials are subsequently treated with an aqueous/alkaline developer. This generally comprises at least one reducing agent and at least one agent which complexes $Ag^+$ ions. However, it is also possible to incorporate the complexing agent into one of the layers on the image side of the recording material. Examples of reducing agents are hydroquinones, combined with optionally alkyl-substituted 1-phenyl-3-pyrazolidones or with 4-methylaminophenol. Besides hydroquinone itself, suitable reducing agents also include, inter alia, methylhydroquinone and chlorohydroquinone. The complexing agent is, for example, a water-soluble thiosulphate or thiocyanate, in particular sodium, potassium or ammonium thiosulphate or thiocyanate. Further suitable complexing agents are sulphites, amines, 2-mercaptobenzoic acid, cyclic imide compounds, alkyl sulphones, alkanolamines, thioethers, 1,2,4-triazolium 3-thiolates and oxazolidones. By means of the complexing agent, the unexposed silver halide in the emulsion layer is dissolved and silver is deposited in the receiving layer owing to the concentration gradient at the development nuclei. This transfer of the silver is generally known as diffusion transfer. In this way, a silver image is formed.

The aqueous/alkaline developer generally has a pH of from 9 to 14, in particular from 10 to 13. The pH is adjusted by addition of at least one alkaline inorganic or organic agent. Particularly suitable inorganic agents are sodium hydroxide, potassium hydroxide, alkali metal phosphates or silicates, sodium carbonate and potassium carbonate. Of the organic alkaline agents, alkanolamines should be mentioned. These then simultaneously have a complexing action on the silver halide. Conventional additives, such as antioxidants, softening agents, etc., may also additionally be present.

The development process may, if desired, be terminated with the aid of a fixing bath. This is generally a weakly acidic aqueous solution (pH from about 5 to 6), which frequently comprises a mixture of sodium dihydrogenphosphate and disodium hydrogenphosphate.

The continuous coating on the back of the recording materials according to the invention causes them to be virtually inert on this side to the strongly alkaline developer. Aluminium ions therefore cannot be released from the back of the metallic support. This in turn increases the yield of the developer.

The image layer on the front of the recording material can also work by the so-called CTX process. In this case, it comprises a combination of a silver-free, light-sensitive layer and a silver halide emulsion layer on top. If desired, a thin interlayer can also be present between the two photosensitive layers in order to prevent silver from reaching the lower light-sensitive layer. The silver halide emulsion layer is significantly more light-sensitive than the silver-free, photosensitive layer. Such combinations are known and described, for example, in EP-A 623 853 or 733 954. The silver-free, light-sensitive layer can be positive- or negative-working. As light-sensitive component, the silver-free layer contains, for example, diazo compounds (in particular ortho-naphthoquinone diazide compounds, of which esters of ortho-naphthoquinone 2-diazide 4- or 5-sulphonic acid and aromatic polyhydroxyl compounds, such as tri-, tetra- or pentahydroxybenzophenone are in turn particularly suitable), diazonium salt polycondensation products, azides or photopolymerizable, ethylenically unsaturated compounds. The silver-free light-sensitive layer usually also contains binders. They may in addition also comprise dyes or coloured pigments, which primarily act as sensitizer. In the production of printing plates, the ink-accepting printing layer is formed from the silver-free, light-sensitive layer. By contrast, the areas in which the hydrophilic surface of the support has been bared form the ink-repelling non-image areas.

The silver halide emulsion layer in the CTX materials is substantially identical with the corresponding layer in the DTR materials described above. The weight of the dried layer is generally from 1 to 10 g/m², preferably from 2 to 6 g/m². In this silver halide layer, a silver image which serves as mask in the subsequent exposure steps is formed by imagewise exposure and development, but without fixing.

The back coating described above has also proven particularly effective in CTX materials. During production, transport, storage and processing of the back-coat ed recording materials, the problems described at the outset have been virtually eliminated.

The examples below illustrate the invention. Percentages are percent by weight, unless otherwise stated. pbw denotes part(s) by weight. Comparative examples are denoted by (C) or (*).

EXAMPLES

Various recording materials were produced. The support material used in each case was an aluminium foil with a thickness of 0.3 mm which had been electrochemically roughened in dilute hydrochloric acid, anodically oxidized in dilute sulphuric acid (weight of the aluminium oxide layer: 3 g/m²) and after-treated with an aqueous sodium hydrogencarbonate solution.

Front Coatings

In each case, one of the following coatings A1 and A2 as applied to the anodized front of this support:

A1: Firstly, a nucleus layer containing 2.3 mg of silver nuclei (produced from colloidal silver) was produced.

An interlayer consisting of a mixture of binder (®Pullulan) and coloured pigment (®Levanyl red dispersion). The interlayer contained 0.1 g/m² of Pullulan and 0.2 g/m² of Levanyl red dispersion.

The interlayer was then coated with an unhardened, negative-working, cadmium-free gelatin/silver chloroiodide emulsion (gelatin:silver chloroiodide weight ratio 99.75:0.25). This layer furthermore contained 1 mmol of 4-hydroxy-6-methyl-1,3,3a,7-tetraazaindene and 2.2 mmol of 1-[3-(2-sulphobenzoylamino)phenyl]-5-mercaptotetraazole per mol of AgX. The silver halide was applied in an amount which corresponded to 2.4 g of silver nitrate per square meter. The gelatin was applied in an amount of 1.6 g/m². The gelatin in turn consisted of two different types. One had a viscosity of 21 mPa s (0.7 g/m²) and the other had a viscosity of 14 mPa s (0.9 g/m²).

Finally, the silver halide emulsion layer was covered by a covering layer consisting of 0.7 g/m² of gelatin having a viscosity of between 10 and 12 mPa·s, 0.1 g/m² of Levanyl red dispersion and 0.12 g/m² of a matting agent having an average particle diameter of 7.5 μm.

A2: Firstly, a silver-free, positive-working layer consisting of 7.8 pbw of novolak (LB 744 from Bakelit AG),
3.2 pbw of a product of the esterification of
    1.5 mol of 1,2-naphthoquinone 2-
    diazide 5-sulphonyl chloride and -continued 1 mol of 2,3,4-trihydroxybenzo-
phenone.
0.4 pbw of 1,2-naphthoquinone 2-diazide
4-sulphonyl chloride and
0.2 pbw of Victoria pure blue (Colour Index No.
44 045)

was applied. This layer was coated with a silver halide emulsion layer. To this end, the following procedure was used:

(1) 45 g of a phenol-formaldehyde resin (MP 120 HH from Gun-ai Kagaku Kogyo KK.) were dissolved in a mixture of 330 g of ethyl acetate and 120 g of methyl ethyl ketone. The solution prepared in this way was then mixed with 600 ml of a 10% strength aqueous gelatin solution, 60 ml of a 10% strength aqueous sodium nonylbenzenesulphonate solution and 150 ml of a 10% strength methanolic solution of turkey red oil, forming a dispersion.

(2) A silver emulsion layer was subsequently produced by preparing a mixture of 1.3 g of the dispersion prepared under (1).
2.0 g of a silver chlorobromide/gelatin
emulstion (chloride content 70 mol %,
average particle size: 0.28 μm,
containing 55 g of gelatin and
0.85 mol of silver halide per kilo-
gram),
100 ml of a 0.1% strength methanolic
solution of 1,3-diethyl-5-{2-[3-(3-
sulphone-propyl)benzoxazol-2-
ylidene]ethylidene}thiohydantoin,
200 ml of a 0.5% strength aqueous/alkaline
solution of 4-hydroxy-6-methyl-
1,3,3a,7-tetraazaindene and
70 ml of a 2% strength aqueous solution of
2,4-dichloro-6-hydroxy-s-triazine
and applied to the silver-free, light-
sensitive layer. After drying, the layer had
a weight of 4.5 g/m².

Back Coatings

In each case, one of the following solutions or mixtures was applied to the non-electrochemically roughened back of the aluminium support and dried:

B1: a solution of 8 g of polyether sulphone (® Ultrason 7020P from
BASF AG),
41 g of N-methylpyrrolidone, and
41 g of methyl ethyl ketone (butanone)

was applied and then dried by means of hot air. The dried layer had a weight of 7.0 g/m².

B2: a coating material which cures by means of free radicals on exposure to UV radiation, comprising 80 pbw of a multifunctional acrylate monomer
(® Laromer LR 8986 from BASF AG),
20 pbw of a multifunctional acrylate monomer
(® Laromer DPGDA from BASF AG), -continued 3 pbw of flow-control agent [CAB 551-0.2, 20%
strength in tripropylene glycol diacryl-
ate (TPGDA), BASF AG],
2 pbw of multifunctional acrylate monomer
(® Ebecryl 170 from UCB S.A.) and
4 pbw of photoinitiator (® Darocur 1173 from
BASF AG)

was applied in such a way that a wet film having a weight of 10 g/m² was formed. The wet film was subsequently exposed for 20 seconds under a 160 W/cm mercury vapour lamp.

B3: a thermally curing coating material comprising 10 pbw of a polyurethane (® Desmodur 2170 from
Bayer AG) and
90 pbw of butanone was applied and dried at a dryer temperature of 150° C., giving a layer having a weight of 21 g/m².

B4: A solution of 8 pbw of a styrene-methyl methacrylate copoly-
mer having a glass transition temperature
Tg of 54° C. in
92 pbw of butanone was applied and subsequently dried by means of hot air, giving a layer having a weight of 2 g/m².

B5: The solution of B4 was applied in such a way that a layer having a layer weight of 1.3 g/m² was formed.

Photosensitive recording materials having the front coating A1 and in each case one of said back coatings were exposed imagewise using an Agfa Galileo laser imagesetter and then developed in a developer as is commercially available for silver halide plates (L5000b from Agfa-Gevaert AG) and after-treated with a universal finisher (L 5300b from Agfa-Gevaert AG).

In the case of the photosensitive recording materials having the front coating A2 and in each case one of said back coatings, the materials were exposed imagewise through a film mask, developed for 30 seconds using a developer comprising 0.3 g of 4-methylaminophenol sulphate (® Metol),
45 g of sodium sulphite,
12 g of hydroquinone,
80 g of sodium carbonate monohydrate,
2 g of potassium bromide,
to 1 kg with demineralized water and then fixed with a solution of 224 g of ammonium thiosulphate,
20 g of sodium sulphite,
to 1 kg with demineralized water.

The plate was subsequently exposed overall with an energy output of 6 J/cm² and then developed again with a commercially available positive developer (EP 260 from Agfa-Gevaert AG).

TABLE

| Example No. | First layer applied | Next layer applied | Coating cosmetics of the silver layer | Cutting in the stack | Copying behaviour of the silver layer |
|---|---|---|---|---|---|
| 1 | B1 | A1 | + | + | + |
| 2 | B2 | A1 | + | + | + |
| 3 | B3 | A1 | + | + | + |
| 4 | B3 | A1 | + | + | + |
| 5 | B1 | A2 | + | + | + |
| 6 | B2 | A2 | + | + | + |
| 7 | B3 | A2 | + | + | + |
| 8 | B4 | A2 | + | + | + |
| 9 | B5 | A1 | + | −(3) | + |
| 10C | A1 | B1 | + | + | −(1) |
| 11C | A1 | B2 | + | + | −(2) |
| 12C | A1 | B5 | + | −(3) | −(1) |
| 13C | A2 | B2 | + | + | −(2) |
| 12C | A2 | B3 | + | + | −(1) |

(1)Plate can no longer be flattened after imagewise exposure and development
(2)Plate scums after imagewise exposure and development, particularly in the edge regions, caused by scattered light during UV drying of the back layer
(3)After cutting in the stack, the plates exhibit considerable cutting burrs at the edges. Damage to the knife is also evident.

We claim as our invention:

1. A process for the production of a photosensitive recording material useful in the production of offset printing plates comprising: providing a dimensionally stable, two-dimensional support having front and back sides and comprising a metal or metal alloy; applying a silver halide-containing photosensitive layer on the front side of the support; and applying a layer resistant to processing chemicals which consists essentially of organic polymeric material on the back side of the support, wherein the layer on the back of the support is applied before the silver halide-containing layer by pouring thereon a liquid comprising organic polymers dissolved or dispersed in organic solvents and drying the liquid.

2. The process according to claim 1, wherein the layer on the back of the support comprises at least one organic polymer having a glass transition temperature ($T_g$) of 50° C. or above.

3. The process according to claim 1, wherein the layer on the back of the support is crosslinked.

4. The process according to claim 3, wherein the crosslinking is carried out by the application of one or more of heat, radiation and oxidants.

5. The process according to claim 1, wherein the support consists of aluminum or an aluminum alloy.

6. The process according to claim 1, wherein the layer on the back of the support weighs from 1.5 to 20 g/m$^2$.

7. The process according to claim 6, wherein the layer on the back of the support weighs from 3 to 10 g/m$^2$.

8. A process for the production of a photosensitive recording material useful in the production of offset printing plates comprising: providing a dimensionally stable, two-dimensional support having front and back sides and comprising a metal or metal alloy; applying a silver halide-containing photosensitive layer on the front side of the support; and applying a layer resistant to processing chemicals which consists essentially of organic polymeric material on the back side of the support, wherein the layer on the back of the support is applied before the silver halide-containing layer and is crosslinked.

9. The process according to claim 8, wherein the layer on the back of the support comprises at least one organic polymer having a glass transition temperature ($T_g$) of 50° C. or above.

10. The process according to claim 8, herein the crosslinking is carried out by the application of one or more of heat, radiation and oxidants.

11. The process according to claim 8, wherein the support consists of aluminum or an aluminum alloy.

12. The process according to claim 8, wherein the-layer on the back of the support weighs from 1.5 to 20 g/m$^2$.

13. The process according to claim 12, wherein the layer on the back of the support weighs from 3 to 10 g/m$^2$.

14. The process according to claim 8, wherein the layer on the back of the support is applied before the silver halide-containing layer by pouring thereon a liquid comprising organic polymers dissolved or dispersed in organic solvents and drying the liquid.

* * * * *